United States Patent
Fujita et al.

(10) Patent No.: US 6,663,710 B1
(45) Date of Patent: Dec. 16, 2003

(54) METHOD FOR CONTINUOUSLY PULLING UP CRYSTAL

(75) Inventors: Kentaro Fujita, Tokyo (JP); Kenji Terao, Tokyo (JP); Hideyuki Isozaki, Tokyo (JP); Iwao Satoh, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/959,530

(22) PCT Filed: Apr. 21, 2000

(86) PCT No.: PCT/JP00/02618

§ 371 (c)(1),
(2), (4) Date: Oct. 29, 2001

(87) PCT Pub. No.: WO00/66818

PCT Pub. Date: Nov. 9, 2000

(30) Foreign Application Priority Data

Apr. 30, 1999  (JP) ............................................. 11-125064

(51) Int. Cl.[7] ............................................. C30B 15/00
(52) U.S. Cl. ............................ 117/23; 117/13; 117/16; 117/26; 117/35; 117/211; 117/218; 117/911; 117/932
(58) Field of Search ............................ 117/26, 35, 211, 117/218, 911, 932, 13, 16, 23

(56) References Cited

U.S. PATENT DOCUMENTS

| | | | | |
|---|---|---|---|---|
| 4,045,181 A | * | 8/1977 | Burd et al. ................... | 117/219 |
| 4,267,010 A | * | 5/1981 | Bates et al. .................... | 117/26 |
| 4,267,153 A | * | 5/1981 | Taylor ......................... | 117/211 |
| 5,089,239 A | * | 2/1992 | Mizuishi et al. ............. | 117/218 |
| 5,128,111 A | * | 7/1992 | Kuehnle ....................... | 422/254 |
| 5,135,727 A | * | 8/1992 | Ibe .............................. | 117/203 |
| 5,454,879 A | * | 10/1995 | Bolger ........................ | 136/253 |

FOREIGN PATENT DOCUMENTS

| | | | |
|---|---|---|---|
| JP | 51-022676 | 2/1976 | |
| JP | 59-97593 | * 5/1984 | .......... C30B/15/34 |
| JP | 59-097593 | 6/1984 | |
| JP | A-6-347748 | 12/1994 | |
| JP | A-10-171045 | 6/1998 | |

OTHER PUBLICATIONS

Abstract of JP 59–097593 (1984). Patent abstracts of Japan.*
English Translation of JP 59–097593 (1984). FLS, Inc.*
Kiyoshi Takahashi, Yoshihiro Hamakawa and Akio Ushirokawa "Solar Power Generation", p. 188, Feb. 20, 1980.
EBARA Solar Modules "Providing the power to make your design a reality . . . " EBARA Solar Inc., 1994.

* cited by examiner

Primary Examiner—Nadine G. Norton
Assistant Examiner—Matthew Song
(74) Attorney, Agent, or Firm—Wenderoth, Lind & Ponack, L.L.P.

(57) ABSTRACT

An apparatus and a method that permits a seed crystal to be directed to a precise location of a melt for growing a ribbon-shaped crystal, but after the crystal has commenced growing, the ribbon-shaped crystal is continuously pulled up so as to produce a longitudinally extending crystal using a continuous pulling device. The method for producing a ribbon-shaped crystal includes growing a ribbon-shaped crystal on a seed crystal using a linear pulling device for pulling the seed crystal and a crystal growing at the end of the seed crystal in a vertical direction, and continuing to pull the ribbon-shaped crystal by using a continuous pulling device having a continuous pulling mechanism. The apparatus for continuous production of a ribbon-shaped crystal includes a linear pulling device for linear vertical pulling of a seed crystal and a ribbon-shaped crystal grown on the seed crystal; a continuous pulling device for pulling the crystal continuously by clamping a portion of the ribbon-shaped crystal; a switching device for changing from the linear pulling device to the continuous pulling device after the seed crystal has passed through the continuous pulling device; and a crystal cutting device for severing the seed crystal from the grown ribbon-shaped crystal.

11 Claims, 7 Drawing Sheets

METHOD FOR CONTINUOUSLY PULLING UP CRYSTAL

BACKGROUND OF THE INVENTION

1. Technical Field

The present invention relates to a method and apparatus for producing a strip-like crystal such as silicon crystal by continuous pulling of the growing crystal, which is suitable for use, for example in a solar battery.

2. Background Art

Crystal growing of materials such as silicon for semiconductor devices is performed as follows. First, a seed crystal is dipped in a molten liquid of the required substance held in an overcooled state in a crucible. Second, a continuous crystal can be grown on the seed crystal from the melt in the crucible by slowly pulling the seed crystal upwards. This method is known as the Czochralski (CZ) method, and uses the apparatus shown in FIG. 6. A seed crystal 12 suspended on a wire hanging from a pulling device 11 at the top section of the furnace is dipped in the melt 14 held in a crucible 13 to commence the crystal growing process as shown in FIG. 6. The wire 15 is wound up slowly by the pulling device 11 so that a crystal 16 may grow on the seed crystal 12. When the seed crystal reaches the upper end of the pulling device 11, the crystal growing process for the growing crystal 16 is terminated. Here, reference numerical 17 shows a heater for controlling the temperature of the melt 14 inside the crucible 13. Also, reference numerical 18 shows an insulator surrounding the heater 17. At this stage, the process is returned to the initial step to restart the crystal growth. However, during the time interval between the termination of one crystal growth and the startup of the next crystal growth, many preparatory steps have to be taken such as re-adjustment of the melt temperature, detaching the grown crystal and attaching a new seed crystal. Thus, it results in a labor-intensive and low-productivity process.

For growing ribbon-shaped crystals of about 0.1 mm thickness, the crystal can be pulled continuously using a reel-type device such as the one shown in FIG. 7, because such thin crystals are flexible. In this type of apparatus, a seed crystal 22 is attached to an end of flexible tape 21 while the opposite side of the tape 21 is attached to a pulley of a winding reel. The crystal growing process by rotating the pulley 23 is as follows. It starts to lower the seed crystal 22 by rotating the pulley 23 to contact the melt 14. Then, the pulley 23 is rotated in the opposite direction to pull the growing crystal upwards. The seed crystal 22 and the grown crystal on the seed crystal can be continuously wound on the pulley 23. In principle, this method is able to produce crystals of an extended length, and it is suitable for growing ribbon-shaped flexible crystals.

However, because there is some temperature gradient in the melt 14 held in the crucible 13, it is necessary for the seed crystal to be dipped precisely in the center of the crucible 13 when starting to grow a crystal on the seed crystal. Also, after commencing crystal pulling, it is necessary to continually maintain the growing crystal in the precise location. However, in an apparatus such as the one shown in FIG. 7, because of the flexibility of the tape 21, the seed crystal 22 can undulate while it is being lowered, thereby making it difficult for the seed crystal 22 to contact the required central location of the melt. The initiation process of crystal growing operation is, therefore, a laborious process, and yet such effort may still result in failure, or even after a successful initiation of a tape crystal growing operation, the pulling process may still have to be discontinued because the growing tape crystal may oscillate so as to interrupt the growth process.

SUMMARY OF THE INVENTION

It is an object of the present invention to provide an apparatus and a method to enable a seed crystal to be directed to the precise location of a melt for growing a ribbon-shaped crystal. After the crystal has commenced growing, the ribbon-shaped crystal is continuously pulled up so as to produce a longitudinally extending crystal using a continuous pulling device.

To achieve the object of the present invention, there is provided a method for producing a ribbon-shaped crystal comprising: growing a ribbon-shaped crystal on a seed crystal using a linear pulling device for pulling the seed crystal and a crystal growing at the end of the seed crystal in a vertical direction, and continuing to pull the ribbon-shaped crystal by using a continuous pulling device having a continuous pulling mechanism.

According to the present method, at the beginning of the crystal growing process to start growing a crystal on the seed crystal, the linear pulling device is used to lowered the seed crystal in a precise desired location of the melt and to start to pull the growing crystal in the vertical direction. This approach enables a ribbon-shaped crystal of a desirable dimensions to grow in a stable and reliable manner. After a sufficient length/height of the ribbon-shaped crystal has been pulled up using the linear pulling device, the continuous pulling device is used to pull the growing crystal continuously so as to produce a continuous strip of ribbon-shaped crystal. Therefore, the method, in principle, is capable of producing a longitudinally extending crystal of a considerable length.

Also, there is provided an apparatus for continuous production of a ribbon-shaped crystal comprising: a linear pulling device for linear vertical pulling of a seed crystal and a ribbon-shaped crystal grown on the seed crystal; a continuous pulling device for pulling the crystal continuously by clamping a portion of the ribbon-shaped crystal; a switching device for the changing pulling device from the linear pulling device to the continuous pulling device before the seed crystal has passed through the continuous pulling device; and a crystal cutting device for severing the seed crystal from the grown ribbon-shaped crystal.

It is preferable that the linear pulling device is provided with a position adjusting mechanism for adjusting the seed dipping location of the seed crystal. It is also preferable that the continuous pulling device is provided with a device for adjusting the position of the continuous pulling device so as to properly initiate the growth of a crystal on the seed crystal. It is also preferable that a crystal cutter is provided to sever the ribbon-shaped crystal grown by continuous pulling into sections of a suitable length.

DETAILED DESCRIPTION OF THE INVENTION

Preferred embodiments will be presented in the following with reference to FIGS. 1 through 5. The reference numbers in the Figures indicate the same parts or equivalent parts.

Figure 1:
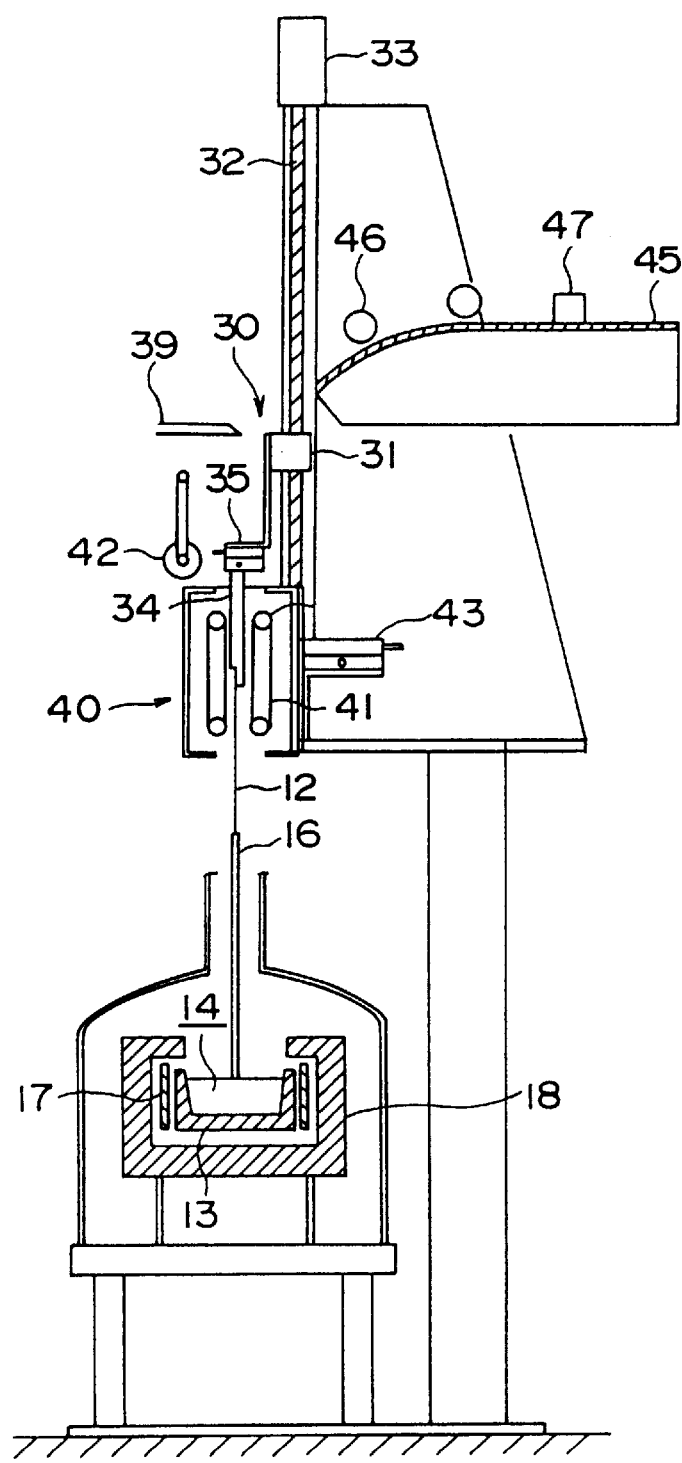
FIG. 1 is a schematic cross sectional view of a first embodiment of the crystal pulling apparatus of the present invention, which shows pulling the seed crystal by the linear pulling device.
Figure 2:
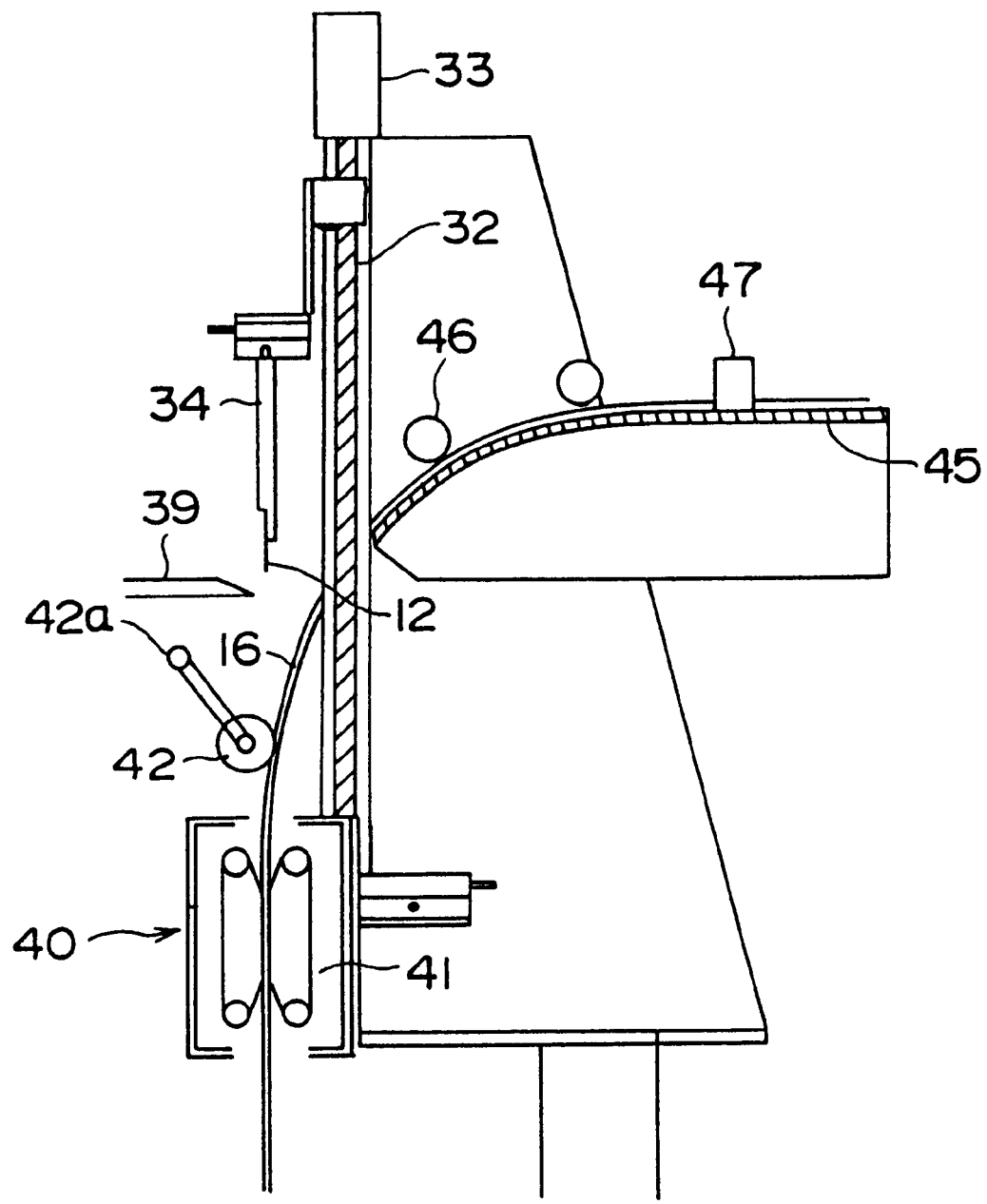
FIG. 2 is a schematic cross sectional view showing continuous pulling of the ribbon-shaped crystal by the continuous pulling device shown in FIG. 1.

FIGS. 1 and 2 show the first embodiment of the continuous crystal pulling apparatus. The apparatus includes a crucible 13 heated by a heater 17 which is placed inside an insulation or insulator 18, and a semiconductor material such as silicon is heated to a high temperature of approximately 1400° C. to produce a melt 14 of the material. This step of the crystal growing process is the same as the conventional process. The apparatus further includes a linear pulling device 30 for pulling a ribbon-shaped crystal growing on a seed crystal in the vertical direction, and a continuous pulling device 40 for continuously grasping and pulling of the ribbon-shaped crystal continuously. The linear pulling device 30 includes: a metal jig 34 for attaching the seed crystal 12; an adjusting stage 35 for adjusting the seed dipping location of the seed crystal 12 inside the crucible 13; and a sliding mechanism 31 operated by a motor 33 for pulling the ribbon-shaped crystal 16, grown at the end of the seed crystal 12, along the guide rail 32.

Similarly, a continuous pulling device 40 is provided below the linear pulling device 30. The continuous pulling device 40 includes: two sets of endless belt 41, and as shown in FIG. 2, it is designed to clamp the ribbon-shaped crystal 16 between the running endless belts 41, thereby causing the ribbon-shaped crystal 16 to move upwards. A crystal cutter 39 is provided for severing the seed crystal 12, which is fixed in the metal jig 34, from the ribbon-shaped crystal 16. A crystal position altering roller 42 swings about a roller axis 42a to adjust the position of the ribbon-shaped crystal 16 towards the ribbon cutting section 45. Similarly the ribbon-shaped crystal 16 is pressed against and moved along the curved surface of the cutting section 45. The ribbon cutter 47 cuts off the ribbon-shaped crystal 16 into tapes of 1 meter length, for example.

The crystal growing apparatus illustrated in FIGS. 1 and 2 utilize a linear pulling device of a guide rail type to produce a linear motion and a continuous pulling device for clamping the grown crystal by a pair of endless belts to produce continuous motion, but it is obvious that other kinds of arrangements can be adopted.

The process of pulling the growing crystal will be explained in the following. First, a seed crystal 12 is attached to the end of the seed attachment metal jig 34 disposed at the tip of the pulling device 31, and the assembly is lowered until the seed crystal 12 comes into contact with the melt 14 held in the crucible 13. The motion of the pulling device 31 is controlled by the guide rail 32, and the seed crystal 12 can be lowered to a precise location controlled by the action of the crystal position adjusting stage 35. The seed attachment metal jig 34 is affixed to the adjusting stage 35 to enable the seed crystal 12 to be located precisely in the desired location. A ribbon-shaped crystal of about 5 cm width by 0.1 mm thickness, for example, can be grown by this method. Also, the seed attachment metal jig 34 has sufficient stiffness so that the seed crystal 12 does not vibrate. When the seed crystal 12 touches the melt 14, the temperature of the melt 14 is reduced to produce an overcooled condition to commence the crystal growing process. When a ribbon-shaped crystal begins to grow on the seed crystal 12, the seed crystal 12 and the ribbon-shaped crystal 16 growing on the end of the seed crystal 12 are slowly pulled up by the action of the linear pulling device 30. During the pulling process, the linear pulling device 31 ascends securely along the guide rail 32 so that the crystal moves upwards accurately in the vertical direction.

When the ribbon-shaped crystal 16 has grown sufficiently in length so that the seed crystal 12 pass through the opening between the pair of endless belts 41, the belts 41 are drawn together to close the opening so as to clamp the crystal 16 with the belts 41. The linear speed of the belts 41 are synchronized to the speed of the linear pulling device 31. When the crystal 16 is completely clamped by the belts 41, the seed crystal 12 is severed from the ribbon-shaped crystal 16 by cutting the seed crystal 12 above the crystal junction, then the linear pulling device 30 is stopped, and the crystal 16 is moved up by the belts 41. The moving crystal 16 is then bent towards the cutting section 45 by the action of the position altering roller 42, as shown in FIG. 2, so as to press the crystal 16 against the curved surface of the cutting section 45. The crystal 16 travels under the ribbon cutter 47 by the pulling/pushing action of the continuous pulling device 40. When a sufficient length of the ribbon-shaped crystal 16 is grown, the ribbon cutter 47 severs the crystal 16 into a length of 1 meter, for example.

The continuous pulling device 40 has a crystal position adjusting stage 43 to permit adjustment of the position of the growing crystal. This arrangement allows control of the starting location of crystal within the area of the melt 14 held in the crucible 13 to enable a ribbon-shaped crystal to be grown in a stable manner. Accordingly, the ribbon-shaped crystal 16 is continuously pulled up by the continuous pulling device 40 and the grown crystal is cut successively into sections of a suitable length. Therefore, successive ribbon-shaped sections of about 1 meter length, 5 cm width and 0.1 mm thickness are produced longitudinally at the end of the cutting section 45. The produced ribbon-shaped crystals can be moved by a belt conveyor and other suitable means to a next processing step. It should be noted here that the linear pulling device may be operated by other mechanical arrangements such as wire winding or threaded shaft. If a threaded shaft is used, the guide rail may be omitted because the threaded shaft can provide the function of linear guiding.

Figure 3:
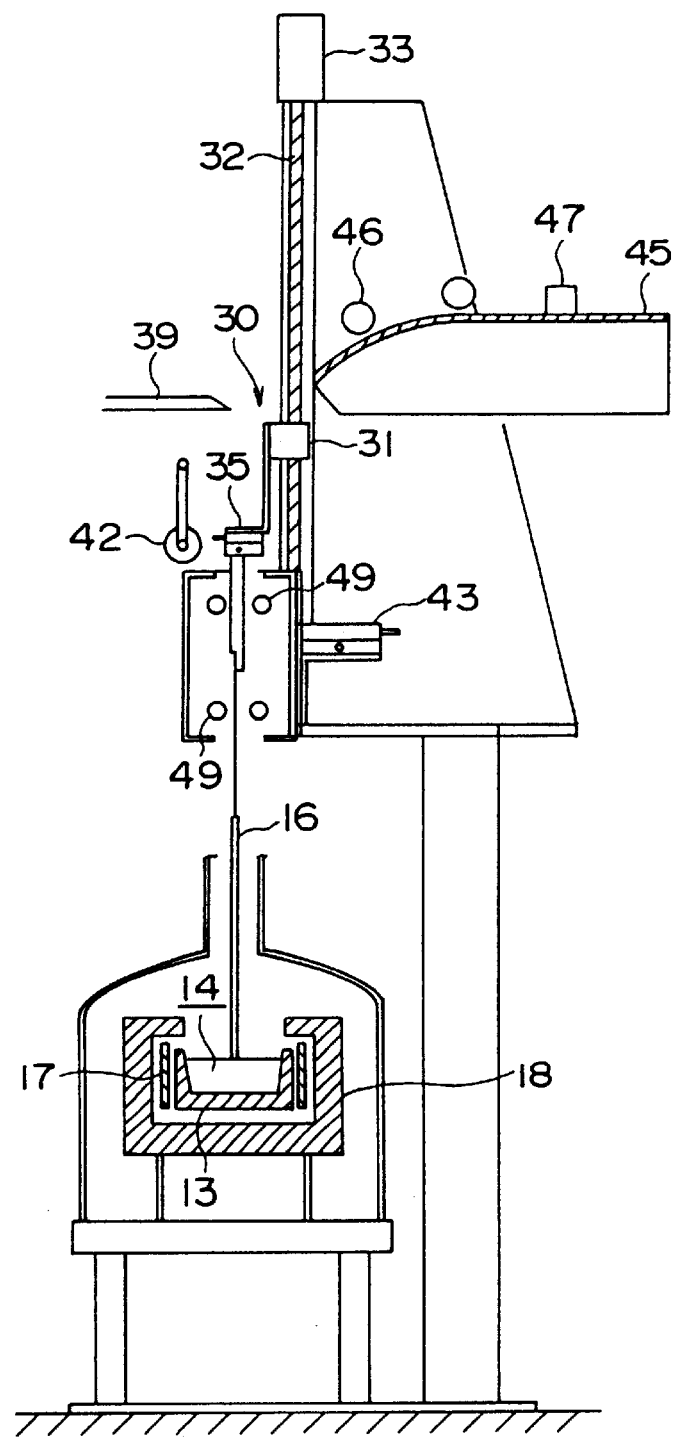
FIG. 3 is a schematic cross sectional view of a second embodiment of the crystal pulling apparatus of the present invention, which shows pulling the seed crystal by the linear pulling device.
Figure 4:
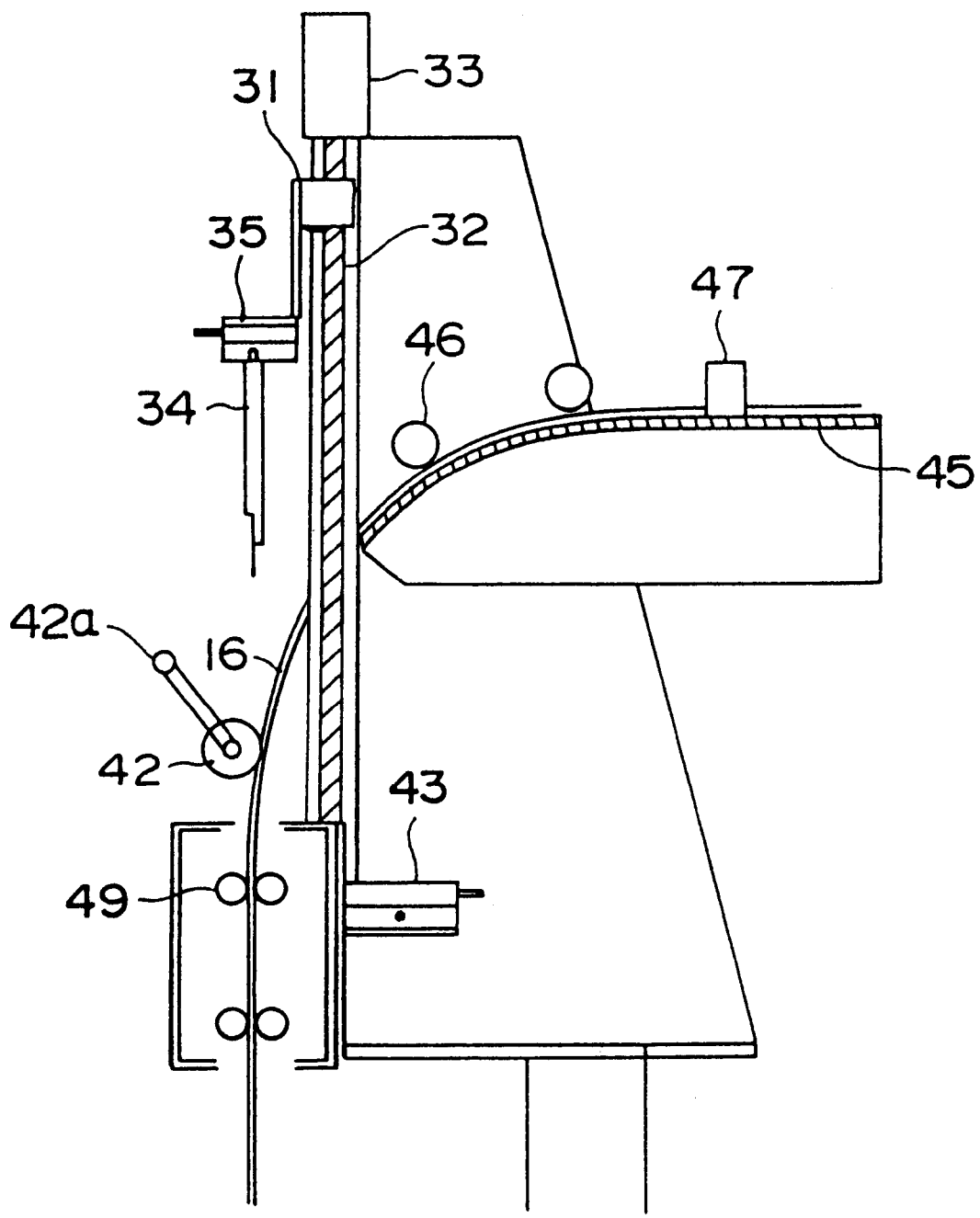
FIG. 4 is a schematic cross sectional view showing continuous pulling of the ribbon-shaped crystal by the continuous pulling device shown in FIG. 3.

FIGS. 3 and 4 show a second embodiment of the crystal pulling apparatus. In this continuous pulling device of the apparatus, endless belts 41 shown in FIGS. 1 and 2 are replaced with rollers 49. Therefore, the basic structure and the operation of the device are the same as those described in the first embodiment.

Figure 5:
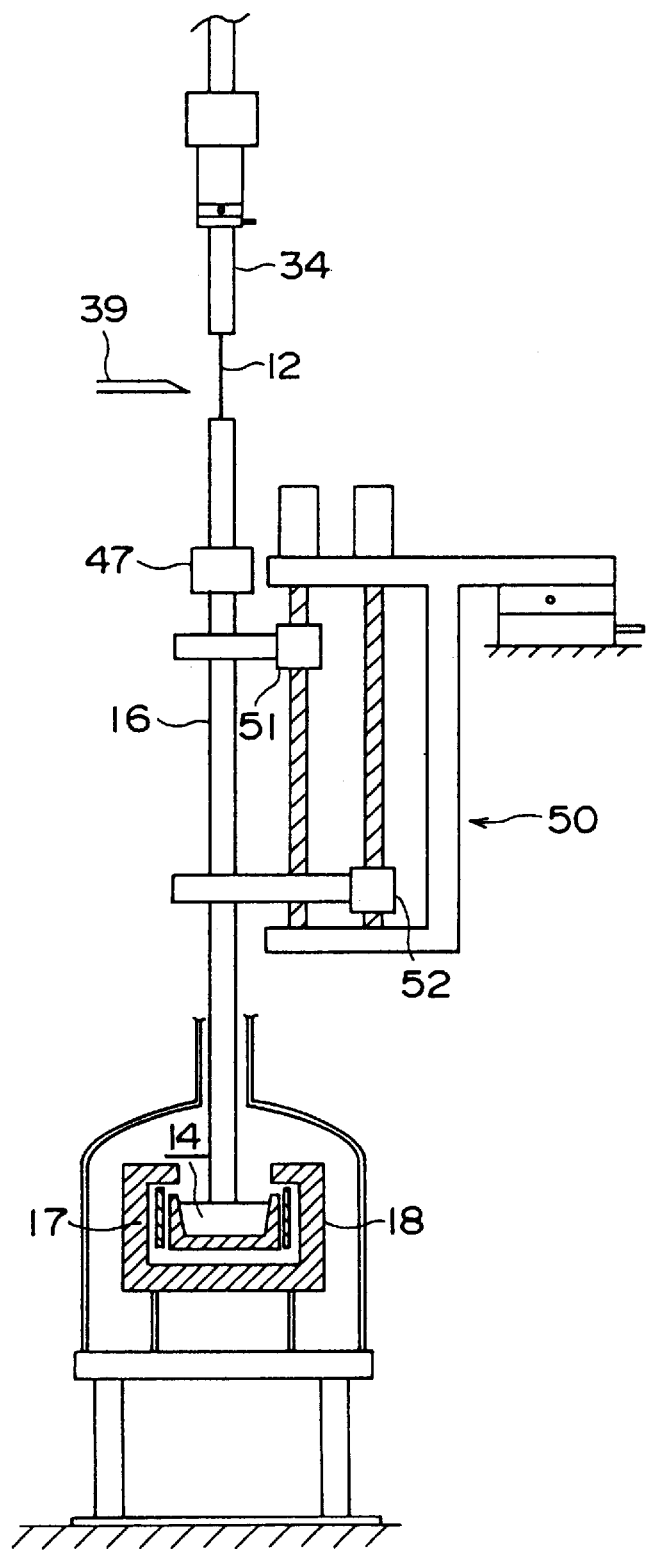
FIG. 5 is a schematic cross sectional view of a third embodiment of the crystal pulling apparatus of the present invention.
Figure 6:
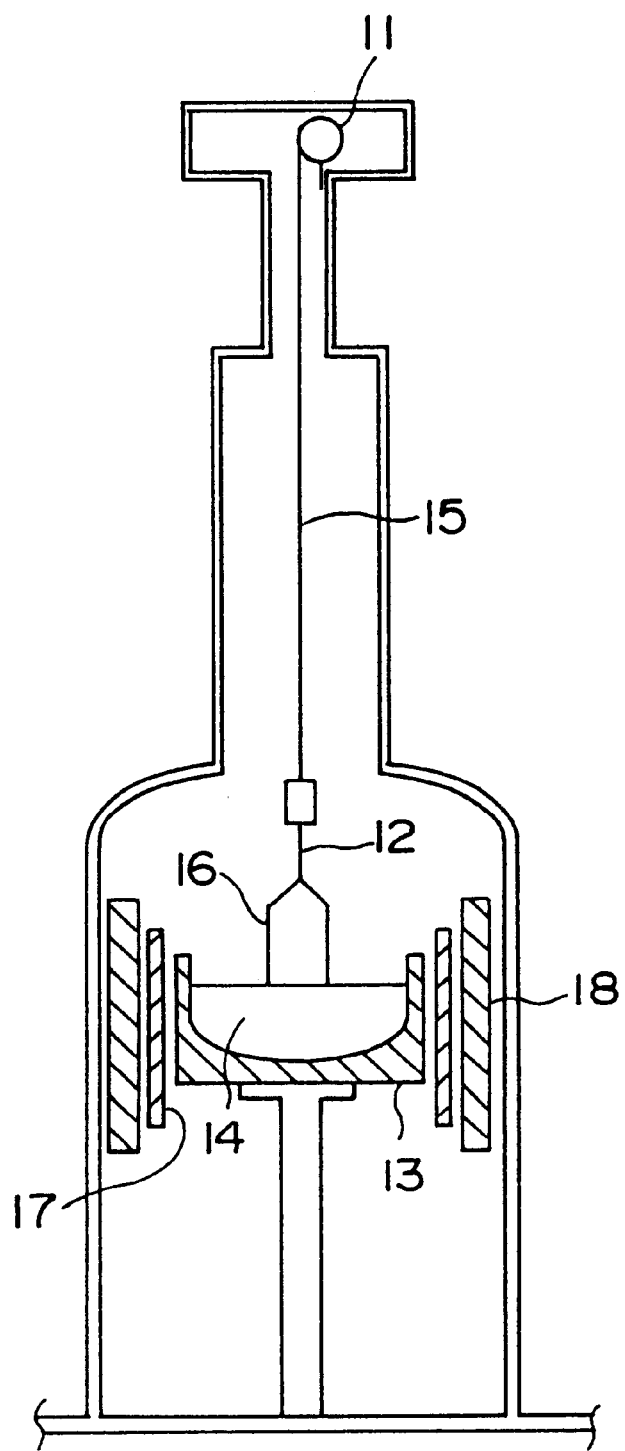
FIG. 6 is a schematic cross sectional view of a conventional CZ crystal pulling apparatus for crystal growing.
Figure 7:
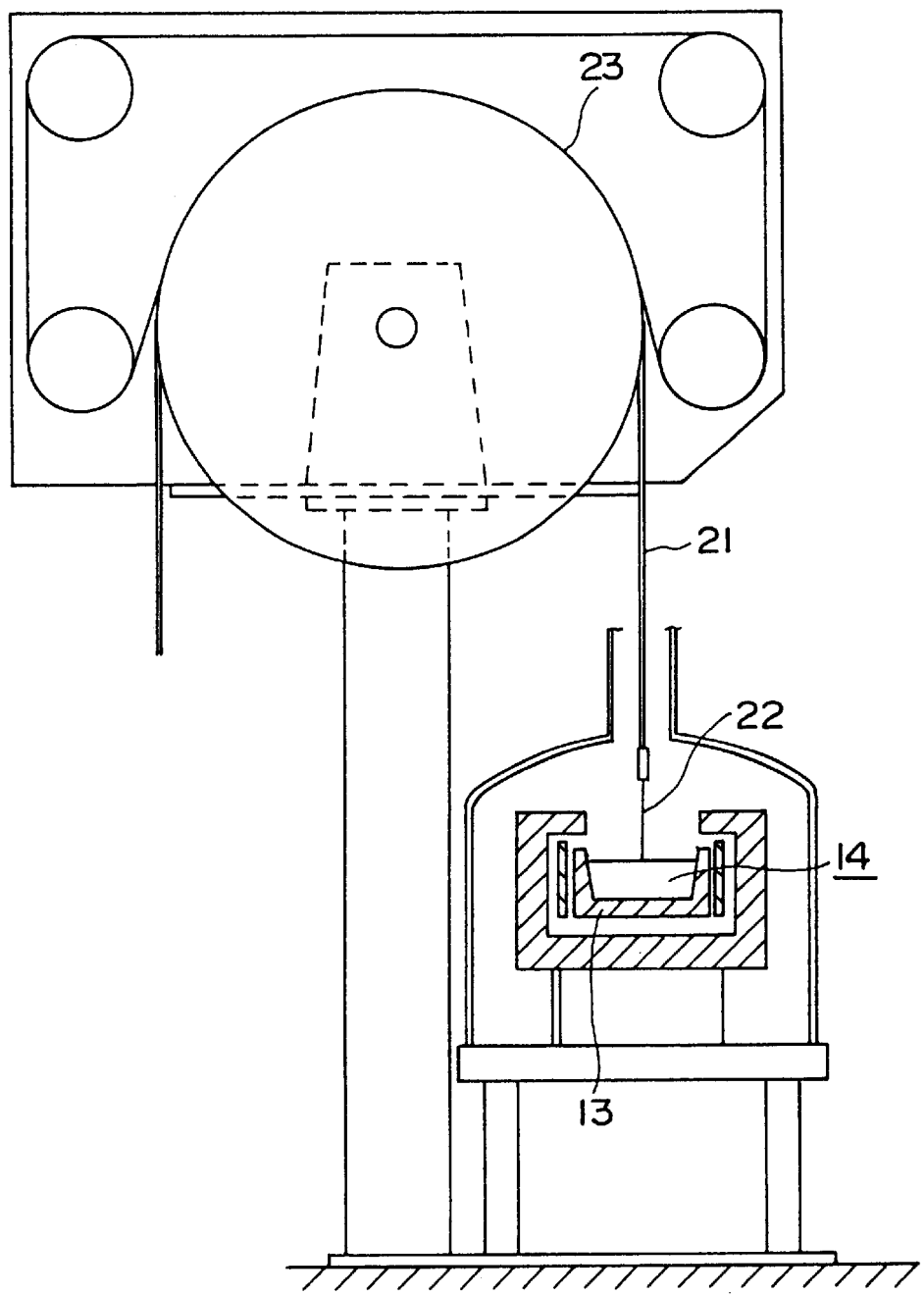
FIG. 7 is a schematic cross sectional view of a conventional reel-type continuous pulling device.

FIG. 5 shows a third embodiment of the crystal pulling apparatus. In this apparatus, the continuous pulling device used in the first or second embodiment is replaced with an alternating clasping device 50 comprising alternating grip sections 51, 52. The linear pulling device is the same as that used in the previous embodiments, but when the crystal grows in length to reach the top section of the continuous pulling device 50, the crystal is gripped by a grip section 51 of the continuous pulling device 50. The crystal cutter 39 cuts the seed crystal 12, after which the ribbon-shaped crystal 16 is held by the grip section 51 of the continuous pulling device 50. The seed crystal 12 is cut off from the ribbon-shaped crystal 16 by the crystal cutter 39, and the ribbon-shaped crystal 16 continues to be pulled by the continuous pulling device 50. The clasping of the ribbon-shaped crystal 16 by the grip section 51 is performed by a pair of elastic parts to clamp the ribbon-shaped crystal 16 therebetween. When the grip section 51 ascends so as to pull up the ribbon-shaped crystal 16 and approaches the upper end of the pulling device 50, the grip section 52 at the bottom clamps the ribbon-shaped crystal 16, and ascends at the speed synchronized to the speed of the grip section 51. When the grip section 51 reaches the upper end, it releases the ribbon-shaped crystal 16, and returns to the bottom end of the continuous pulling device 50. The ribbon-shaped crystal 16 is then pulled up by the grip section 52 until the grip section 52 reaches the top end. When the grip section 52 approaches the top end, the grip section 51 at the bottom clamps the ribbon-shaped crystal 16 and pulls up the ribbon-shaped crystal 16 at the speed synchronized to the speed of the grip section 52. When the grip section 52 reaches the upper end, it releases the ribbon-shaped crystal 16, and the ribbon-shaped crystal 16 is now pulled by the grip section 51, and the grip section 52 returns to the lower end of the continuous pulling device 50. Such alternating clasping action is repeated to continue the process of pulling the ribbon-shaped crystal 16 continuously. The crystal pulled to the cutting section is cut off by the crystal cutter 47 into longitudinal sections of a suitable length.

As explained above, the present crystal production apparatus enables the growth of a ribbon-shaped crystal by pulling a seed crystal from the melt under precisely controlled vertical motion by combining the linear pulling device with a continuous pulling device. Accordingly, it is no longer necessary to spend time performing wasteful steps required in the conventional linear pulling device, such as replacing the seed crystal, so that a long length of high quality ribbon-shaped crystal can be produced efficiently using the present method and apparatus designed for the method.

Although certain preferred embodiments of the present invention have been shown and described in detail, it should be understood that various changes and modifications may be made therein without departing from the scope of the appended claims.

The present invention relates to a method and apparatus for producing a strip-like (ribbon-shaped) crystal such as silicon crystal by continuous pulling, and the present invention can be suitably utilized in the semiconductor manufacturing field. The produced strip-like (ribbon-shaped) crystal such as silicon crystal can be used as solar battery cells and so on.

What is claimed is:

1. A method for continuous growing crystal, the method comprising:

growing a ribbon-shaped crystal on a seed crystal using a linear pulling device for pulling the seed crystal and a crystal growing at an end of the seed crystal in a vertical direction;

switching the device for pulling the ribbon-shaped crystal from the linear pulling device to a continuous pulling device; and continuing to pull the ribbon-shaped crystal with only the continuous pulling device, wherein the continuous pulling device has a continuous pulling mechanism.

2. A method according to claim 1, further comprising:

severing the seed crystal from the grown ribbon-shaped crystal after the seed crystal has passed through the continuous pulling device.

3. A method according to claim 1, further comprising adjusting a dipping position of the seed crystal before the ribbon-shaped crystal is vertically pulled up by the linear pulling device.

4. A method according to claim 1, further comprising adjusting a position of the ribbon-shaped crystal as the ribbon-shaped crystal is continuously pulled up by the continuous pulling device.

5. A method according to claim 1, further comprising severing the ribbon-shaped crystal after the crystal is pulled up continuously.

6. A method according to claim 1, wherein the linear pulling device comprises:

a guide rail;

a sliding mechanism provided on the guide rail;

a motor for pulling the sliding mechanism along the guide rail;

an adjusting stage connected to the sliding mechanism; and a metal jig for attaching the seed crystal, wherein the metal jig is connected to the adjusting stage to permit adjustment of a seed dipping location of the seed crystal inside a crucible.

7. A method according to claim 1, wherein the continuous pulling device comprises at least one set of belts or rollers for clamping the ribbon-shaped crystal therebetween so as to continuously move the ribbon-shaped crystal upwardly.

8. A method according to claim 7, wherein, after the seed crystal passes between the belts or rollers, the belts or rollers are drawn together to clamp the ribbon-shaped crystal.

9. A method according to claim 8, wherein the method further comprises synchronizing linear speed of the belts or roll to the speed of the linear pulling device.

10. A method according to claim 8, wherein the method further comprises severing the seed crystal from the ribbon-shaped crystal after the ribbon-shaped crystal has been clamped by the belts or rollers.

11. A method according to claim 8, wherein the method further comprises bending the ribbon-shaped crystal towards a cutting section after the ribbon-shaped crystal has passed between the belts or rollers, and cutting lengths of the ribbon-shaped crystal.

* * * * *